United States Patent
Georgin

(10) Patent No.: US 9,975,530 B2
(45) Date of Patent: May 22, 2018

(54) METHOD AND SYSTEM FOR ELECTRONIC BRAKE ACTUATOR DETECTION

(71) Applicant: GOODRICH CORPORATION, Charlotte, NC (US)

(72) Inventor: Marc Georgin, Dayton, OH (US)

(73) Assignee: GOODRICH CORPORATION, Charlotte, NC (US)

(*) Notice: Subject to any disclaimer, the term of this patent is extended or adjusted under 35 U.S.C. 154(b) by 218 days.

(21) Appl. No.: 14/564,480

(22) Filed: Dec. 9, 2014

(65) Prior Publication Data

US 2016/0159328 A1   Jun. 9, 2016

(51) Int. Cl.
| | |
|---|---|
| B60T 8/1755 | (2006.01) |
| B60T 8/172 | (2006.01) |
| B60W 10/184 | (2012.01) |
| B60T 8/17 | (2006.01) |
| G01D 5/14 | (2006.01) |
| G01R 15/04 | (2006.01) |

(52) U.S. Cl.
CPC ............... *B60T 8/17* (2013.01); *B60T 8/172* (2013.01); *B60T 8/1703* (2013.01); *G01D 5/142* (2013.01); *G01R 15/04* (2013.01); *B60T 2270/406* (2013.01)

(58) Field of Classification Search
None
See application file for complete search history.

(56) References Cited

U.S. PATENT DOCUMENTS

| | | | | |
|---|---|---|---|---|
| 4,222,615 A | * | 9/1980 | Ang | B60T 8/17613 303/122.04 |
| 5,888,212 A | * | 3/1999 | Petrofsky | A61F 2/68 623/24 |
| 6,752,474 B1 | * | 6/2004 | Olberding | B60T 7/20 188/112 R |
| 8,149,102 B1 | * | 4/2012 | Miller | H04W 4/38 340/506 |
| 9,448,613 B1 | * | 9/2016 | Liljegren | G08B 6/00 |
| 2003/0034774 A1 | * | 2/2003 | Pfeil | B60T 13/662 324/207.2 |
| 2005/0127854 A1 | * | 6/2005 | Charles | H02M 11/00 318/109 |
| 2005/0269872 A1 | * | 12/2005 | Ralea | B60T 8/00 303/20 |
| 2008/0154470 A1 | | 6/2008 | Goranson et al. | |

(Continued)

OTHER PUBLICATIONS

Extended European Search Report dated Apr. 6, 2016 in European Application No. 15198579.3.

*Primary Examiner* — Jean Paul Cass
(74) *Attorney, Agent, or Firm* — Snell & Wilmer, L.L.P.

(57) ABSTRACT

An electronic brake system is provided comprising a brake control unit (BCU), an electronic brake actuation controller (EBAC) electrically coupled to the BCU, and an electronic brake actuator (EBA) electrically coupled to the EBAC. The EBAC is configured to detect the EBA based on an electric signal from the EBA. A method of detecting an EBA is also provided. The method comprises the steps of measuring a voltage on an input pin connected to an EBAC, determining an EBA type connected to the input pin based on the voltage, and activating circuitry and software in an EBAC corresponding to the EBA type.

13 Claims, 5 Drawing Sheets

(56) References Cited

U.S. PATENT DOCUMENTS

| | | | | |
|---|---|---|---|---|
| 2010/0152989 A1* | 6/2010 | Smith | ........................ | B60T 7/20 |
| | | | | 701/78 |
| 2013/0241527 A1 | 9/2013 | Russell et al. | | |
| 2014/0300987 A1* | 10/2014 | Otaguro | .................. | H02P 25/18 |
| | | | | 360/71 |
| 2014/0300992 A1* | 10/2014 | Otaguro | .................... | H02P 6/14 |
| | | | | 360/86 |
| 2014/0300993 A1* | 10/2014 | Otaguro | ................. | G11B 19/28 |
| | | | | 360/99.08 |
| 2016/0159328 A1* | 6/2016 | Georgin | .................... | B60T 8/17 |
| | | | | 701/70 |

* cited by examiner

METHOD AND SYSTEM FOR ELECTRONIC BRAKE ACTUATOR DETECTION

FIELD OF INVENTION

The present disclosure relates to braking systems, and, more specifically, to automatic detection and operation of an electronic brake actuator.

BACKGROUND

Aircraft, like any other vehicle, rely on braking systems to slow down or stop. In many braking systems, an electronic brake actuator (EBA) may be controlled remotely by an electronic brake actuator controller (EBAC). Wiring throughout the aircraft may enable signals to pass between the EBAC and EBA. As aircrafts age, many may be retrofitted with newer, improved systems. However, changing one component in the brake system, for example, may result in rewiring and replacement of other components in the brake system for compatibility.

SUMMARY

In various embodiments, an electronic brake system may comprise a brake control unit (BCU), an electronic brake actuation controller (EBAC) electrically coupled to the BCU, and an electronic brake actuator (EBA) electrically coupled to the EBAC. The EBAC is configured to detect a type of the EBA based on an electric signal from the EBA.

In various embodiments, a voltage sensing circuit may be configured to detect a voltage of the electric signal. The EBA may have a pull-up resistor electrically coupled to the voltage sensing circuit. The EBA may have a load sensor electrically coupled to the voltage sensing circuit. A sense resistor may be electrically coupled in series with the EBA. The voltage sensing circuit may be configured to detect the voltage at a node between the EBA and the sense resistor. The EBAC is configured to use a first circuit based on the voltage and the first circuit is compatible with Hall Effect sensors. A circuit configured to use a second circuit based on the voltage and the second circuit is compatible with a resolver.

In various embodiments, a method of detecting an EBA may comprise the steps of measuring a voltage on an input pin connected to an EBAC, determining an EBA type connected to the input pin based on the voltage, and activating circuitry and software in the EBAC corresponding to the EBA type.

In various embodiments, the method may also include measuring the voltage with a voltage sensing circuit. The voltage may be measured using a voltage divider. The method may also include the steps of removing the EBA from the input pin, connecting a second EBA to the input pin, determining a second EBA type connected to the input pin based on a second voltage, and activating the circuitry and software in the EBAC corresponding to the second EBA type. A pull-up resistor of the second EBA may be selected to produce the second voltage. The voltage may be measured between a sense resistor of the EBAC and the pull-up resistor of the second EBA. The method may also comprise providing power to a Hall Effect sensor of the second EBA.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The scope of the disclosure is defined by the appended claims. For example, the steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
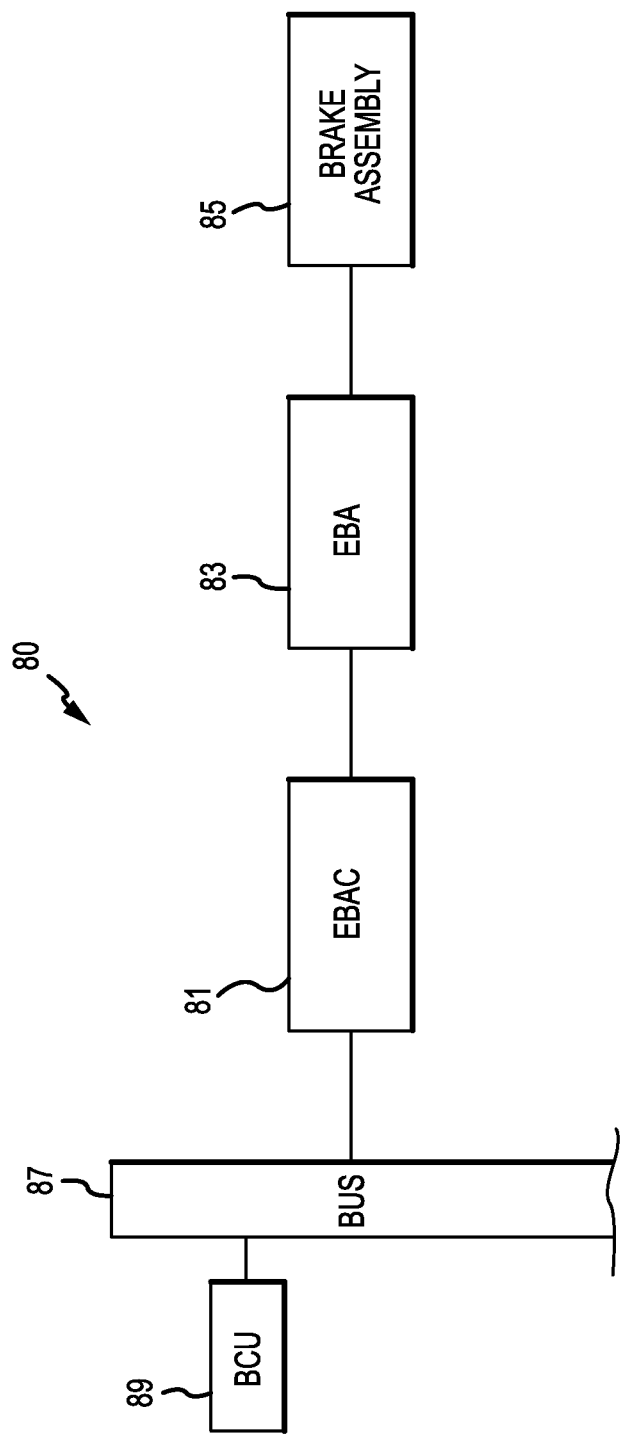
FIG. 1 illustrates an exemplary brake control system, in accordance with various embodiments.

With reference to FIG. 1, a brake control system 80 may have an electrical brake actuation controller 81 ("EBAC"), an electric brake actuator 83 ("EBA"), and a brake assembly 85 in accordance to various embodiments. The EBAC 81 may provide force commands to the EBA 83, directing the EBA 83 to cause the brake assembly 85 to mechanically operate, driving the aircraft brakes to provide braking power. For example, the EBAC 81 may be responsible for executing brake actuation instructions received via a logical connection, such as a controller area network ("CAN") bus 87, from other aircraft systems, such as a brake control unit 89 ("BCU"). In this manner, the brakes may be operated. In further embodiments, the EBAC 81 may provide force commands to more than one EBA 83, for example, a first EBA and a second EBA, or any number of EBAs, in order to operate more than one brake assembly, for example, a first brake assembly and a second brake assembly in concert.

As discussed herein, various aspects of the present disclosure may be implemented in various logical units of a processor having a non-transitory memory. In various embodiments, various aspects may be implemented in multiple processors and/or memories. For example, the disclosed system may be implemented within the EBAC 81. Various aspects of the disclosed system may be implemented within the EBAC 81 and/or the EBA 83 and/or BCU 89.

In various embodiments, different models of EBA 83 with different modes of operation may be installed in brake control system 80. For example, one type of EBA 83 may use a resolver to identify the angular position of the electric motor in EBA 83. Another type of EBA 83 may use Hall Effect sensors to identify the angular position of the electric motor in EBA 83. Some types of EBA 83 may include load sensors that output a load signal in voltage, while other types of EBA 83 may include load cells that output a load signal in current. The input/output interfaces of different types of EBA 83 may use input/output pins for different signals.

Figure 2:
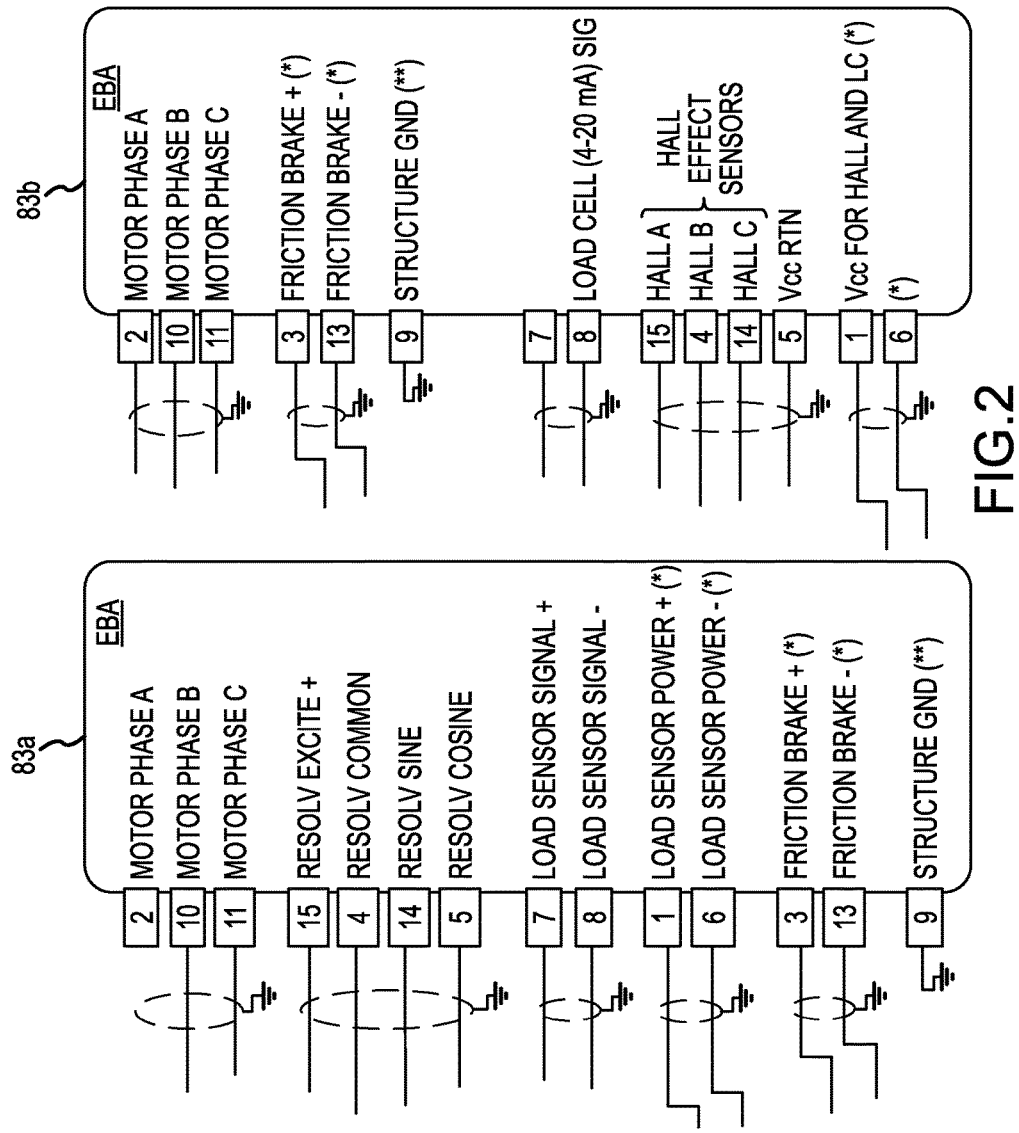
FIG. 2 illustrates input/output panels from different electronic brake actuators configured to use the same wiring, in accordance with various embodiments.

With reference to FIG. 2, the input/output pins of different types of electronic brake actuators may be configured to be controlled by the same EBAC (e.g., EBAC 81 in FIG. 1), in accordance with various embodiments. An interface may comprise pins that convey electrical signals into or out of an EBA or EBAC. For example, EBA 83*a* has a 16 pin input/output interface in FIG. 2. Pins 2, 10, and 11 provide phase A, phase B, and phase C power, respectively, to operate a three-phase actuator. EBA 83*a* is configured to operate using a resolver for positioning information. Pin 15 provides excitement to the resolver. Pins 4, 14, and 5 provide position information. Pins 7 and 8 provide a load sensor signal. For example, pins 7 and 8 of EBA 83*a* may provide a load sensor voltage. The load sensor voltage may be from 0-20 mV. Pins 1 and 6 provide load sensor power. Pins 3 and 13 provide friction brake readings. Pin 9 grounds EBA 83*a*.

EBA 83*b* is a different type of EBA than EBA 83*a*. In that regard, EBA 83*b* has different power inputs and a different mode of operation. EBA 83*b* operates by providing the angular position of the brake actuator via Hall Effect sensors, whereas EBA 83*a* uses a resolver. EBA 83*b* may, however, share many input/output pins with EBA 83*a*. For example, pins 2, 10, and 11 may still provide phase A, phase B, and phase C power, respectively. EBA 83*b* may provide friction data on pins 3 and 13, and EBA 83*b* may also be grounded by pin 9.

In various embodiments, EBA 83*b* may differ from EBA 83*a* in that pin 8 of EBA 83*b* may provide a load cell current. For example, pin 8 of EBA 83*b* my carry a load cell signal in the form of 4-20 mA current while pin 7 is dormant. In that regard, EBA 83*a* may output a signal encoded in a load sensor voltage and EBA 83*b* may output a signal encoded in a load sensor current. Other pins of EBA 83*b* may also differ from the pins in EBA 83*a*. For example, pin 1 of EBA 83*b* may be a power input for the Hall Effect sensor and load cell. Pins 15, 4, and 14 may be used to transmit angular position of the motor as measured by Hall Effect sensors. In that regard, pins 4, 14, and 15 may carry a signal from each of three Hall Effect sensors in EBA 83*b* used to provide the position of the motor in EBA 83*b*. Pin 5 may provide the voltage return for the DC power provided to Hall Effect sensors via pin 1.

Figure 3A:
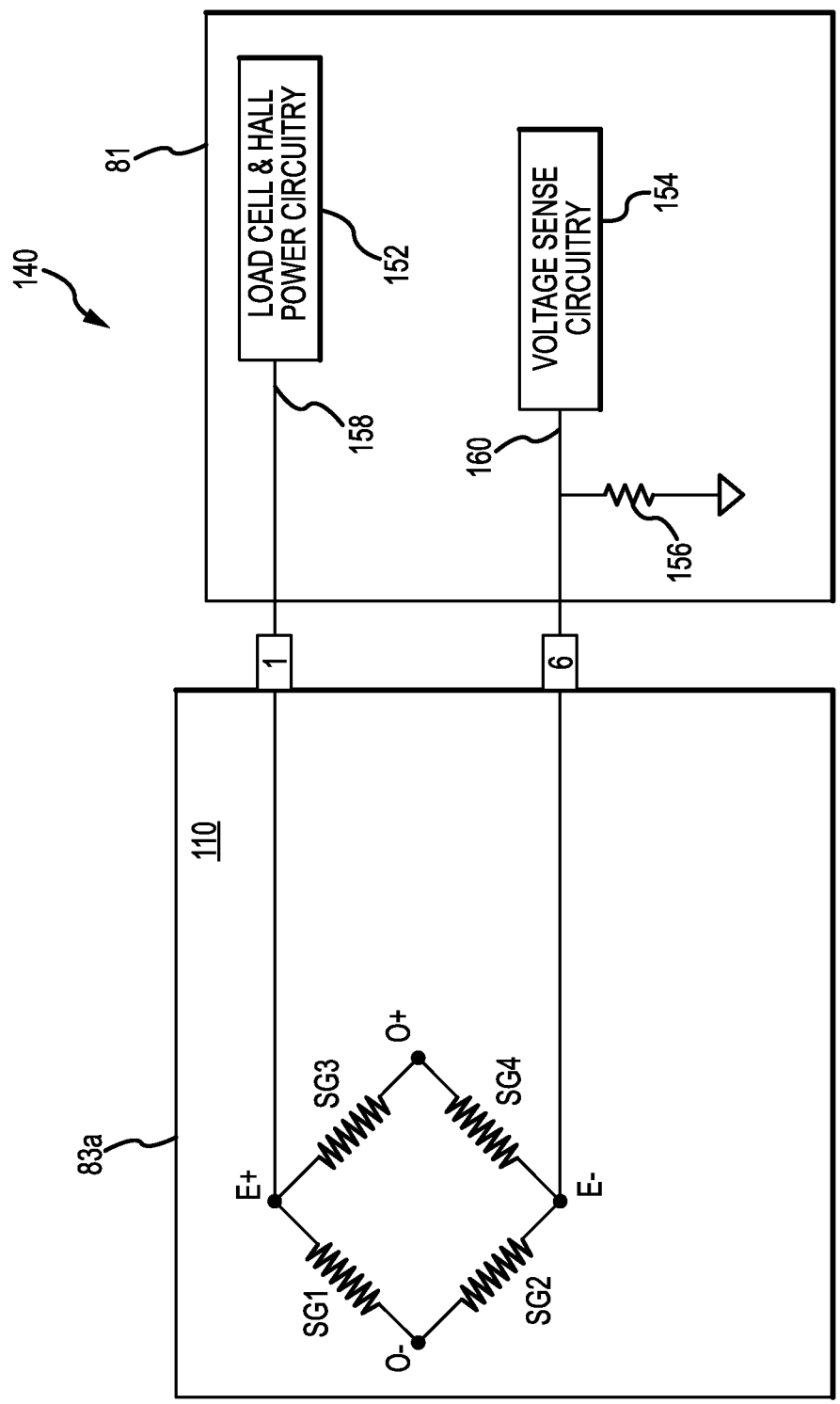
FIG. 3A illustrates a load cell and EBA detection system for an EBAC to detect a voltage, in accordance with various embodiments.

With reference to FIG. 3A, an EBAC 81 configured to detect whether EBA 83*a* or EBA 83*b* (from FIG. 2) are connected to EBAC 81 based on the signal of pin 6 (from FIG. 2). EBAC 81 and EBA 83*a* are electrically connected in brake system 140. In various embodiments, EBA 83*a* may include load sensor 110. Load sensor 110 may output a signal from the E+ and E− terminals. For example, E+ may be attached to pin 1 of EBA 83*a* as shown in FIG. 2. Similarly, E− may be attached to pin 6 of EBA 83*a* as shown in FIG. 2. Thus, pin 1 may be coupled to the load cell and Hall power circuitry 152 of EBAC 81 via conduit 158. Pin 6 may be coupled to voltage sense circuitry 154 through conduit 160. The voltage difference between E+ and E− may be measured in EBAC 81. A sense resistor 156 may be coupled between E− and ground and may operate as a voltage divider when EBA 83*a* is connected to EBAC 81. In that regard, the voltage drop across sense resistor 156 is indicative of the voltage drop through load sensor 110. In various embodiments, the voltage measured by voltage sense circuitry 154 in response to startup with EBA 83*a* connected may be from 0-40 mV.

Figure 3B:
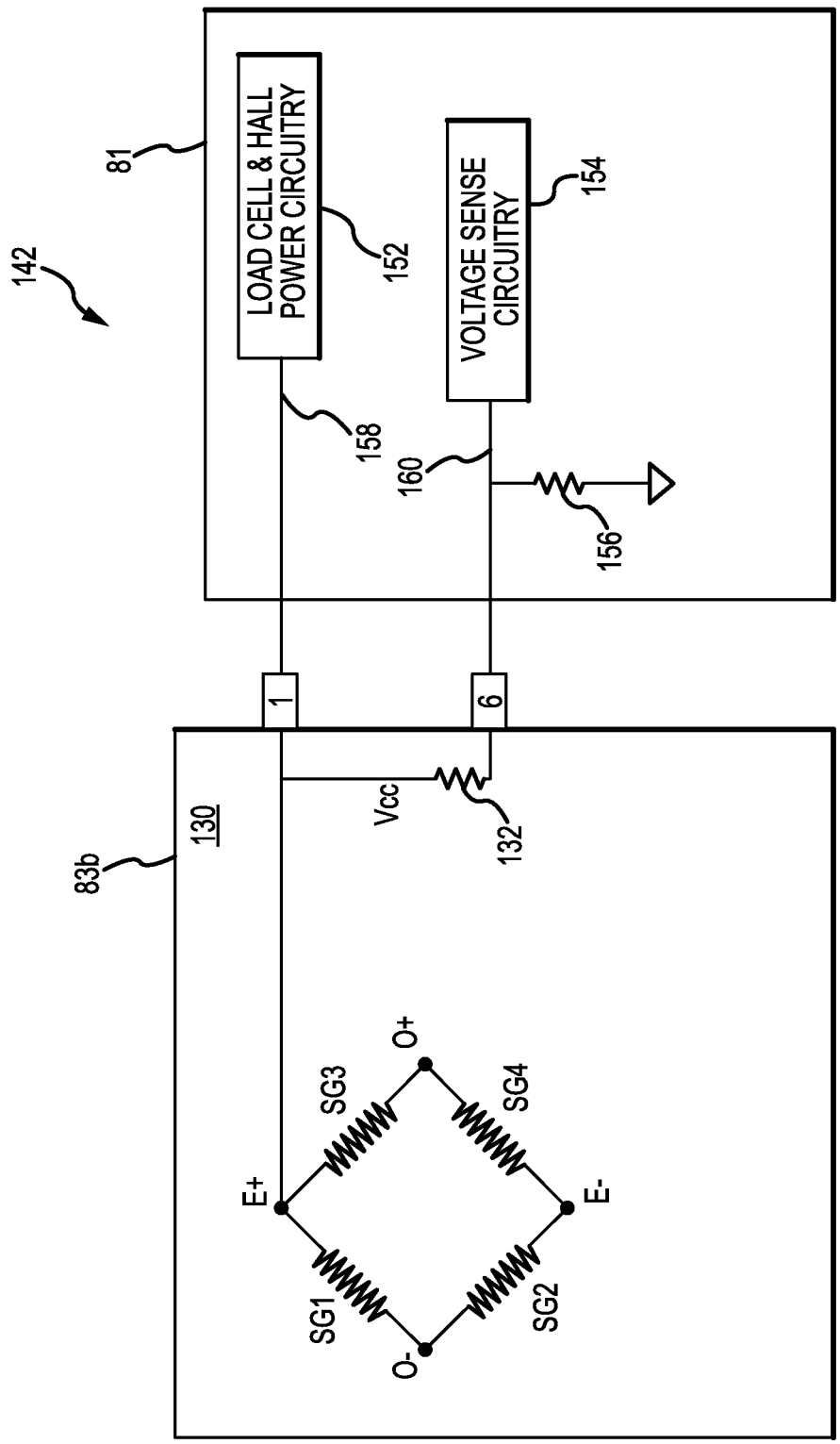
FIG. 3B illustrates a load cell and EBA detection system for an EBAC to detect a current, in accordance with various embodiments.

With reference to FIG. 3B, an EBAC 81 may be configured to detect when EBA 83*b* is connected to EBAC 81 in electronic brake system 142, in accordance with various embodiments. The circuitry in EBAC 81 in FIG. 3B is identical to that in FIG. 3A, including load cell & Hall power circuitry 152, voltage sense circuitry 154, and sense resistor 156. EBA 83*b* includes load cell 130. Internally, EBA 83*b* has pin 1 connected to load cell & Hall power circuitry 152 through conduit 158. Load cell & Hall power circuitry 152 may be modified to provide DC power to both Hall Effect sensors (when EBA 83*b* using Hall Effect sensors is connected to EBAC 81) and the load cell since both use a DC power supply. The load cell is connected to pin 1 at E+. A pull-up resistor 132 may extend between the node at E+ and voltage sense circuitry 154. Pin 6 may be coupled to voltage sense circuitry 154 through conduit 160. Pull-up resistor 132 may be selected to have a different voltage drop across pull-up resistor 132 than the voltage drop across load sensor 110 of FIG. 3A. Sense resistor 156 may form a voltage divider. The resistance of sense resistor 156 may be chosen and is thus known. Thus, the voltage measured at voltage sense circuitry 154 may indicate that either EBA 83*b* is connected or that EBA 83*a* (as shown in FIG. 3A) is connected.

Figure 4:
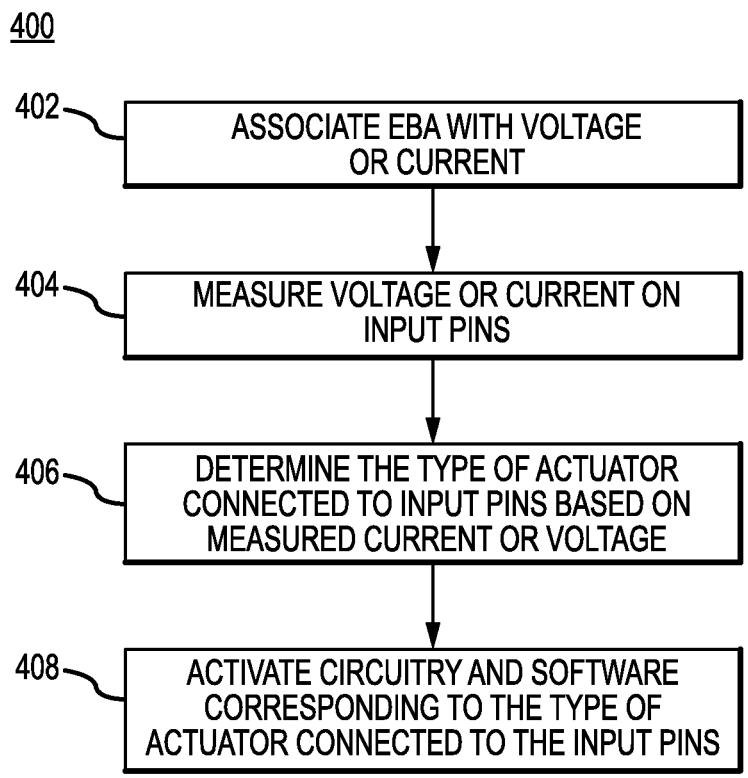
FIG. 4 illustrates a method for detecting the type of EBA installed in a braking system, in accordance with various embodiments.

In various embodiments, EBAC may activate different circuitry and software in response to detecting EBA 83*a* or EBA 83*b*. With reference to FIG. 4, a method 400 for detecting and activating the correct circuitry in accordance with various embodiments is shown. Each type of EBA (83*a* or 83*b*) to be connected to EBAC 81 is associated with a current or voltage (Step 402). EBAC 81 measures the voltage or current on input pins (Step 404). The measurements may be taken using circuitry as shown in FIGS. 3A and 3B. The voltage measured when EBA 83*a* is connected to EBAC 81 may be different than the voltage measured when EBA 83*b* is connected to EBAC 81. The measured voltages can be predicted or chosen by selecting the resistance values for pull-up resistor 132 or sense resistor 156. The measurement and check may be executed each time an aircraft is started.

In various embodiments, EBAC 81 may determine the type of actuator connected to input pins based on the measured current or voltage (Step 406). If EBA 83*a* is connected, then the voltage value read across sense resistor 156 (coupled to pin 6 of EBA 83*a*) may correspond to a voltage divider circuit using the load cell equivalent resistance and the sense resistor. If EBA 83*b* is connected, then the voltage value read across sense resistor 156 (coupled to pin 6 of EBA 83*b*) corresponds to a voltage divider circuit using the pull up resistor and the sense resistor. For example, voltage sense circuitry 154 may measure a voltage of 5-35 mV in response to EBA 83a connected to EBAC 81. Voltage sense circuitry 154 may measure a voltage of 3 V or more in response to EBA 83b connected to EBAC 81. Thus, EBAC 81 may determine that EBA 83b is connected in response to voltage sense circuitry 154 measuring a voltage of 5 V at startup. EBAC 81 may then activate circuitry and software in EBAC 81 corresponding to the type of actuator that is connected to the input pins (Step 408). In that regard, the circuitry and software may be matched to the type of actuator detected. Continuing the above example, EBAC 81 may activate circuitry to control EBA 83b (rather than EBA 83a) in response to determining that EBA 83b is connected to EBAC 81. Active circuitry in EBAC 81 may vary, for example, based on whether the EBA uses Hall Effect sensors or a resolver to indicate angular motor position.

In various embodiments, EBAC 81 automatically detects the type of EBA connected and activates the correct circuitry and software to control the connected EBA. Different actuators may be connected to EBAC 81 using the same input wires, as shown in FIG. 2, for different purposes.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An electronic brake control system for an aircraft, comprising:
    a brake control unit;
    an electronic brake actuation controller electrically coupled to the brake control unit;
    an electronic brake actuator electrically coupled to the electronic brake actuation controller, the electronic brake actuator comprising a motor, wherein the electronic brake actuator comprises at least one of a first actuator type having a Hall Effect sensor configured to identify an angular position of the motor or a second actuator type having a resolver to identify the angular position of the motor, and wherein the electronic brake actuation controller is configured to detect a type of the electronic brake actuator based on a difference between a voltage drop across a pull-up resistor located within the electronic brake actuator where the electronic brake actuator is of the first actuator type and a voltage drop across a load sensor located within the electronic brake actuator where the electronic brake actuator is of the second actuator type;
    a sense resistor electrically coupled in series with the electronic brake actuator, wherein the sense resistor is coupled between ground and at least one of the pull-up resistor or an E− terminal of the load sensor, and wherein the sense resistor is located within the electronic brake actuation controller; and
    a brake assembly of the aircraft in operable communication with the electronic brake actuator.

2. The electronic brake control system of claim 1, wherein the electronic brake actuation controller further comprises a voltage sensing circuit configured to detect a voltage of an electrical signal from the electronic brake actuator.

3. The electronic brake control system of claim 2, wherein the electronic brake actuator comprises the pull-up resistor of the first actuator type and the pull-up resistor is electrically coupled to the voltage sensing circuit.

4. The electronic brake control system of claim 2, wherein the electronic brake actuator comprises the load sensor of the second actuator type and the load sensor is electrically coupled to the voltage sensing circuit.

5. The electronic brake control system of claim 2, wherein the voltage sensing circuit is configured to detect the voltage at a node between the electronic brake actuator and the sense resistor.

6. The electronic brake control system of claim 2, wherein the electronic brake actuator comprises a first circuit compatible with the Hall Effect sensor.

7. The electronic brake control system of claim 6, wherein the electronic brake actuation controller comprises a second circuit compatible with the resolver.

8. A method of detecting an electronic brake actuator for an aircraft, comprising:
    coupling a first electronic brake actuator to an electronic brake actuation controller, the first electronic brake actuator comprising at least one of a first actuator type having a Hall Effect sensor or a second actuator type having a resolver, the electronic brake actuation controller comprising a sense resistor coupled in series with the first electronic brake actuator, wherein the sense resistor is located within the electronic brake actuation controller and is coupled between ground and at least one of a pull-up resistor located within the first electronic brake actuator where the first electronic brake actuator is of the first actuator type or an E-terminal of a load sensor located within the first electronic brake actuator where the first electronic brake actuator is of the second actuator type;

determining a type of the first electronic brake actuator based on at least one of a voltage drop across the pull-up resistor of the first electronic brake actuator where the first electronic brake actuator is of the first actuator type or a voltage drop across the load sensor of the first electronic brake actuator where the first electronic brake actuator is of the second actuator type; and activating circuitry and software in the electronic brake actuation controller corresponding to the type of the first electronic brake actuator.

9. The method of claim 8, further comprising measuring the voltage drop using a voltage sensing circuit located within the electronic brake actuation controller.

10. The method of claim 9, wherein sense resistor forms a voltage divider.

11. The method of claim 8, further comprising:

connecting a second electronic brake actuator to the electronic brake actuation controller, the second electronic brake actuator comprising at least one of the first actuator type or the second actuator type;

determining a type of the second electronic brake actuator based on at least one of a voltage drop across a pull-up resistor of the second-electronic brake actuator where the second electronic brake actuator is of the first actuator type or a voltage drop across a load sensor of the second electronic brake actuator where the second electronic brake actuator is of the second actuator type; and activating the circuitry and software in the electronic brake actuation controller corresponding to the type of the second electronic brake actuator.

12. The method of claim 8, wherein activating circuitry and software in the electronic brake actuation controller comprises activating a circuitry that is compatible with the Hall Effect sensor.

13. The method of claim 8, wherein activating circuitry and software in the electronic brake actuation controller comprises activating a circuitry that is compatible with the resolver.

* * * * *